US012568624B2

(12) United States Patent
Zhang et al.

(10) Patent No.: US 12,568,624 B2
(45) Date of Patent: Mar. 3, 2026

(54) MEMORY DEVICE CONTAINING TSG DECK AND METHOD OF FORMING THE SAME

(71) Applicant: Yangtze Memory Technologies Co., Ltd., Wuhan (CN)

(72) Inventors: Wenbo Zhang, Wuhan (CN); Kai Yu, Wuhan (CN); Zhiyong Lu, Wuhan (CN); Sheng Peng, Wuhan (CN); Zhaohui Cheng, Wuhan (CN); Xiaoming Mao, Wuhan (CN); Zhangyi Li, Wuhan (CN); Jing Gao, Wuhan (CN); Zongliang Huo, Wuhan (CN); Lei Xue, Wuhan (CN); Meng Zhang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 372 days.

(21) Appl. No.: 18/319,276

(22) Filed: May 17, 2023

(65) Prior Publication Data

US 2024/0224520 A1     Jul. 4, 2024

Related U.S. Application Data

(60) Provisional application No. 63/436,230, filed on Dec. 30, 2022.

(30) Foreign Application Priority Data

Apr. 20, 2023     (CN) .......................... 202310436142.1

(51) Int. Cl.
H10B 43/27     (2023.01)
H10B 41/27     (2023.01)

(52) U.S. Cl.
CPC ............. *H10B 43/27* (2023.02); *H10B 41/27* (2023.02)

(58) Field of Classification Search
CPC ................................ H10B 41/27; H10B 43/27
See application file for complete search history.

(56) References Cited

U.S. PATENT DOCUMENTS

| | | | | |
|---|---|---|---|---|
| 10,411,032 | B2 * | 9/2019 | Kim | H10B 43/35 |
| 2014/0264549 | A1 * | 9/2014 | Lee | H10B 41/27 |
| | | | | 438/269 |
| 2017/0186755 | A1 * | 6/2017 | Lai | H01L 21/0332 |
| 2018/0122823 | A1 * | 5/2018 | Li | H10D 62/83 |
| 2019/0074291 | A1 * | 3/2019 | Lu | H10D 64/037 |
| 2022/0045045 | A1 * | 2/2022 | Lee | H10B 41/10 |

* cited by examiner

*Primary Examiner* — Evren Seven
(74) *Attorney, Agent, or Firm* — Anova Law Group, PLLC

(57)     ABSTRACT

Memory device, memory system and formation method are provided. The method includes forming a sacrificial layer over a dielectric-pair stack, the sacrificial layer containing a top selective gate (TSG) cut structure over the dielectric-pair stack; forming a channel plug structure including a lower plug portion in the dielectric-pair stack and an upper plug portion through the sacrificial layer; forming a barrier layer at least enveloping the upper plug portion of the channel plug structure after a removal of the sacrificial layer; and forming a semiconductor layer over the dielectric-pair stack to embed the TSG cut structure, the barrier layer, and the upper plug portion of the channel plug structure.

9 Claims, 18 Drawing Sheets

900C

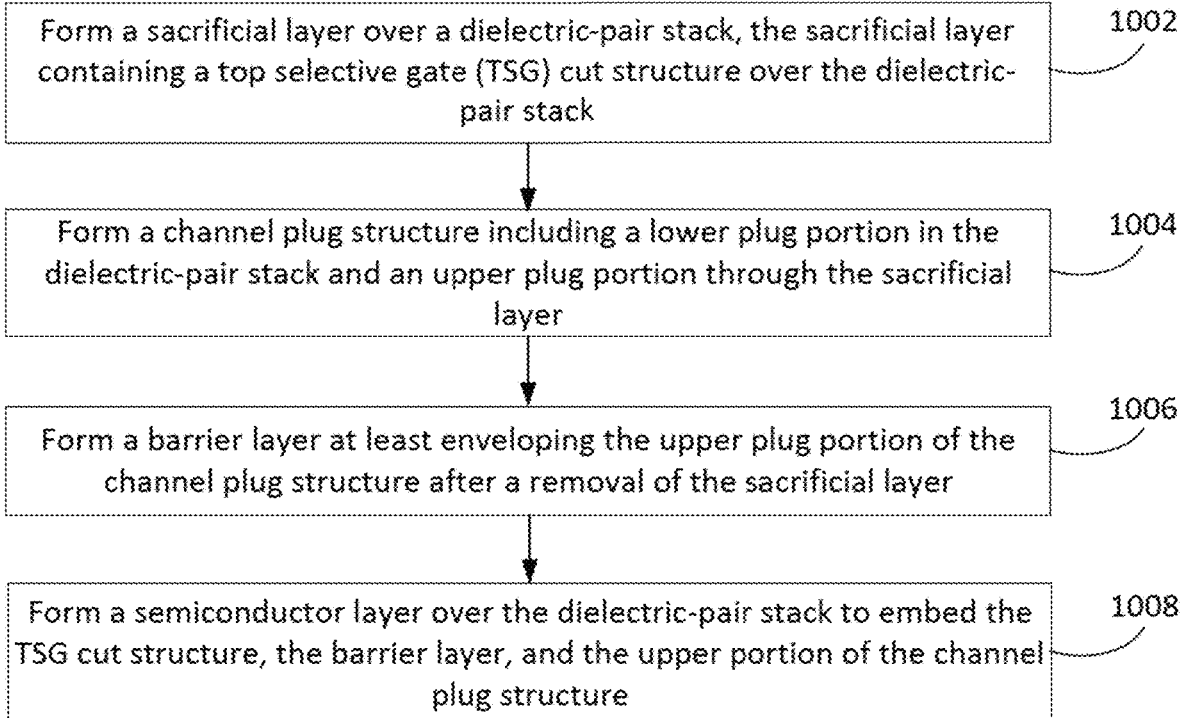

Form a sacrificial layer over a dielectric-pair stack, the sacrificial layer containing a top selective gate (TSG) cut structure over the dielectric-pair stack ⟶ 1002

Form a channel plug structure including a lower plug portion in the dielectric-pair stack and an upper plug portion through the sacrificial layer ⟶ 1004

Form a barrier layer at least enveloping the upper plug portion of the channel plug structure after a removal of the sacrificial layer ⟶ 1006

Form a semiconductor layer over the dielectric-pair stack to embed the TSG cut structure, the barrier layer, and the upper portion of the channel plug structure ⟶ 1008

MEMORY DEVICE CONTAINING TSG DECK AND METHOD OF FORMING THE SAME

CROSS-REFERENCE TO RELATED APPLICATIONS

This application claims the priority of Provisional Patent Application No. 63/436,230, filed on Dec. 30, 2022, and the priority of Chinese Application No. 202310436142.1, filed on Apr. 20, 2023, the contents of which are incorporated herein by reference in their entirety.

FIELD OF THE DISCLOSURE

The present disclosure generally relates to the field of memory device and, more particularly, relates to memory device, memory system, and formation method thereof.

BACKGROUND

A three-dimensional (3D) memory architecture can address the density limitation in planar memory cells. As semiconductor technology advances, for 3D memory devices, such as 3D NAND memory devices, it is desirable to reduce die size along bit line direction of the 3D memory device to improve the area utilization of wafers. However, it is a challenge to reduce die size without changing the storage capacity.

The disclosed devices and methods are directed to solve one or more problems set forth above and other problems in the art.

BRIEF SUMMARY OF THE DISCLOSURE

One aspect of the present disclosure provides a method for forming a memory device. The method includes forming a sacrificial layer over a dielectric-pair stack, the sacrificial layer containing a top selective gate (TSG) cut structure over the dielectric-pair stack; forming a channel plug structure including a lower plug portion in the dielectric-pair stack and an upper plug portion through the sacrificial layer; forming a barrier layer at least enveloping the upper plug portion of the channel plug structure after a removal of the sacrificial layer; forming a semiconductor layer over the dielectric-pair stack to embed the TSG cut structure, the barrier layer, and the upper plug portion of the channel plug structure.

In some embodiments, forming the barrier layer at least enveloping the upper plug portion of the channel plug structure includes performing an oxidation process to convert an outer portion of the upper plug portion into the barrier layer, or depositing the barrier layer over the upper plug portion of the channel plug structure.

In some embodiments, at an interface between the upper and lower plug portions of the channel plug structure, the upper plug portion includes a width less than the lower plug portion.

In some embodiments, after the removal of the sacrificial layer, the lower plug portion of the channel plug structure is exposed by the dielectric-pair stack; and the barrier layer is further formed by deposition over the exposed surface of the lower plug portion of the channel plug structure or formed by converting a top portion of the exposed surface of the lower plug portion into the barrier layer.

In some embodiments, the lower plug portion of the channel plug structure includes a sidewall surrounded by a channel layer, the channel layer extending through the dielectric-pair stack; and the barrier layer is further formed by deposition over a top surface of the channel layer or formed by converting a portion of the top surface of the channel layer into the barrier layer.

In some embodiments, forming the channel plug structure includes forming a trench passing through the sacrificial layer and above a channel structure, the channel structure extending through the dielectric-pair stack; forming a recess in the dielectric-pair stack by removing a portion of the channel structure; and forming the upper plug portion of the channel plug structure in the trench and the lower plug portion in the recess, wherein the lower plug portion is in contact with a channel layer in the channel structure.

In some embodiments, the channel structure includes a functional layer, the channel layer, and a dielectric filling material, formed in a channel hole that extends through the dielectric-pair stack. The functional layer is formed between the channel layer and the dielectric-pair stack, and the dielectric filling material is formed over the channel layer to at least partially fill the channel hole. In some embodiments, forming the recess in the dielectric-pair stack by removing the portion of the channel structure includes removing a top portion of the dielectric filling material to form the recess surrounded by the channel layer.

In some embodiments, the functional layer includes a blocking layer adjacent to the channel layer, a tunneling layer adjacent to the dielectric-pair stack, and a charge trap layer between the blocking layer and the tunneling layer, and forming the recess in the dielectric-pair stack by removing the portion of the channel structure includes removing a top portion of each of the dielectric filling material, the channel layer, the blocking layer to form the recess surrounded by the charge trap layer.

In some embodiments, the method further includes performing a planarizing process to at least remove a top portion of each of the semiconductor layer, the upper plug portion of the channel plug structure, and the barrier layer, such that the channel plug structure, the TSG cut structure, a sidewall of the barrier layer are exposed by the semiconductor layer.

In some embodiments, the TSG cut structure is formed between the upper plug portion of the channel plug structure and an adjacent upper plug portion of an adjacent upper plug portion.

In some embodiments, forming the channel plug structure further includes forming an airgap in the channel plug structure under the sacrificial layer.

In some embodiments, the method further includes forming slits through the dielectric-pair stack; replacing one dielectric layer of the dielectric-pair stack with a conductor layer to form a layer stack comprising alternating layers of a conductor layer and another dielectric layer; and forming slit structures in the slits extending through the layer stack.

In some embodiments, the TSG cut structure is made of a material including a dielectric layer, and the channel plug structure is made of a material comprising polysilicon.

Another aspect of the present disclosure provides a memory device. The memory device includes a stack structure; a semiconductor layer over the stack structure and containing a top selective gate (TSG) cut structure; a channel plug structure passing through the semiconductor layer, and penetrating into the stack structure under the semiconductor layer and in contact with a channel layer extending through the stack structure; and a barrier layer including at least a portion formed at a bottom surface of the semiconductor layer above the channel layer.

In some embodiments, the channel plug structure further includes an upper plug portion in the semiconductor layer and a lower plug portion in the stack structure, and at an interface between the upper and lower plug portions of the channel plug structure, the upper plug portion includes a width less than the lower plug portion.

In some embodiments, the barrier layer is further formed between the lower plug portion and the semiconductor layer.

In some embodiments, a top surface of the channel plug structure and a top surface of the semiconductor layer are coplanar with each other.

In some embodiments, the barrier layer further includes a portion through the semiconductor layer, and further between the semiconductor layer and an upper plug portion of the channel plug structure along a lateral direction of the semiconductor layer.

In some embodiments, the channel plug structure includes a lower plug portion, the lower plug portion including a sidewall surrounded by the channel layer; and the barrier layer is further formed a top surface of the channel layer.

In some embodiments, the memory device further includes a channel structure extending through the stack structure and include a functional layer between the channel layer and the stack structure. The functional layer includes a blocking layer adjacent to the channel layer, a tunneling layer adjacent to the dielectric-pair stack, and a charge trap layer between the blocking layer and the tunneling layer. A lower plug portion of the channel plug structure is formed above the channel layer and the blocking layer, and further surrounded by the charge trap layer.

In some embodiments, the stack structure includes a dielectric-pair stack or a layer stack including alternating layers of a conductor layer and a dielectric layer.

In some embodiments, the channel plug structure contains an airgap under the semiconductor layer.

In some embodiments, orthographic projections of the channel plug structure and the TSG cut structure on a plane parallel to a surface of the stack structure are non-overlapped.

In some embodiments, the channel plug structure includes a varying cross section, and a minimum cross section width of the channel plug structure is greater than a maximum cross section width of the TSG cut structure.

In some embodiments, the TSG cut structure is made of a material including a dielectric layer, and the channel plug structure is made of a material comprising polysilicon.

In some embodiments, slit structures extend through the stack structure and laterally arranged in parallel, and the TSG cut structure is in parallel with the slit structures laterally and separates a plurality of channel plug structures configured between the slit structures into groups.

Another aspect of the present disclosure provides a memory system. The memory system includes a controller and a memory device. The memory device includes a stack structure; a semiconductor layer over the stack structure and containing a top selective gate (TSG) cut structure; a channel plug structure passing through the semiconductor layer, and penetrating into the stack structure under the semiconductor layer and in contact with a channel layer extending through the stack structure; and a barrier layer including at least a portion formed at a bottom surface of the semiconductor layer above the channel layer.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 10 illustrates an exemplary method for forming a memory device consistent with various disclosed embodiments of the present disclosure.

DETAILED DESCRIPTION

Figure 1:
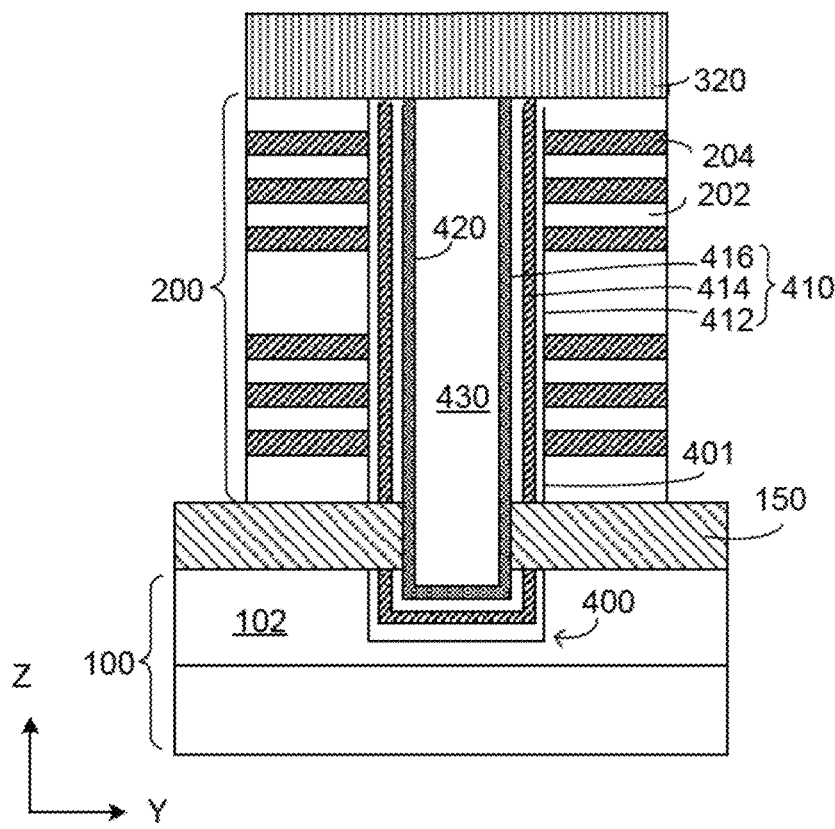
FIGS. 1-4, 5A-5C, 6-8, and 9A-9C illustrate a cross-section view of an exemplary memory device at various fabrication stages consistent with various disclosed embodiments of the present disclosure.

Reference will now be made in detail to exemplary embodiments of the present disclosure, which are illustrated in the accompanying drawings. Wherever possible, the same reference numbers will be used throughout the drawings to refer to the same or like parts.

For illustrative purposes, specific configurations and arrangements are described herein, and a person skilled in the pertinent art should understand that other configurations and arrangements without departing from the spirit and scope of the present disclosure are also encompassed within the scope of the present disclosure. It will be apparent to a person skilled in the pertinent art that the present disclosure can also be employed in a variety of other applications.

It should be noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain un-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can include one or more layer thereupon, there-above, and/or there-below. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "memory device" or "3D memory device" refers to a semiconductor device at least including vertically oriented strings of memory cell transistors (referred to herein as "memory cell strings," such as NAND strings) disposed over a laterally oriented substrate so that the memory cell strings extend in the vertical direction with respect to a lateral surface of the substrate.

As used herein, the term "vertical/vertically" means nominally perpendicular to the lateral surface of a substrate. Accordingly, a lateral direction of the substrate is along the lateral surface of the substrate, and a vertical direction is substantially perpendicular to the lateral surface (or a lateral direction) of the substrate of a memory device.

For example, a lateral direction may refer to X-direction and/or Y-direction in X-Y plane of the lateral surface of the substrate of the memory device. A vertical direction may refer to Z-direction with respect to the X-Y plane of the lateral surface of the substrate.

In a memory device or a 3D memory device, such as a 3D NAND memory device or a NAND Flash memory device, the x-direction may be the word line direction of the 3D memory device, and the y-direction may be the bit line direction of 3D memory device. The memory device may include staircase structures arranged in the x-direction of memory array structure. Each word line extends laterally in the x-direction across a memory plane to a respective stair (level) in staircase structure.

The present disclosure provides memory device, memory system, memory card, and method of forming the same.

For example, FIGS. 1-4, 5A-5C, 6-8, and 9A-9C illustrate a cross-section view of an exemplary memory device at various fabrication stages consistent with various disclosed embodiments of the present disclosure; and FIG. 10 illustrates an exemplary method for forming a memory device consistent with various disclosed embodiments of the present disclosure.

Figure 2:
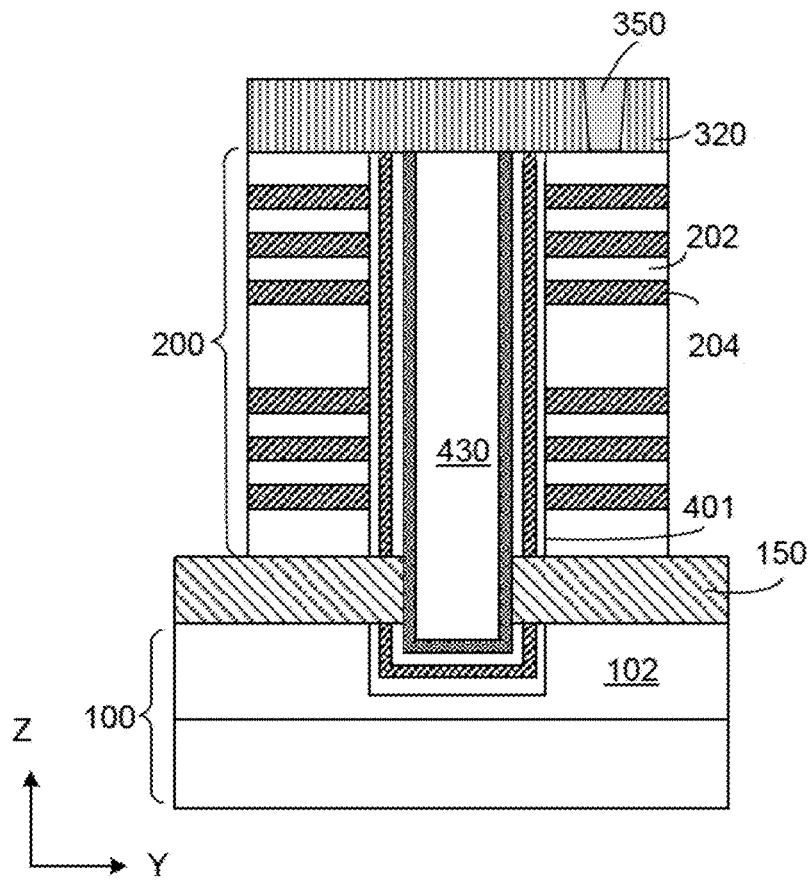

As illustrated in FIG. 10, at 1002, a sacrificial layer may be formed over a dielectric-pair stack of a memory device. The sacrificial layer may contain a top selective gate (TSG) cut structure over the dielectric-pair stack. In some embodiments, corresponding structures are illustrated in FIGS. 1-2. Referring to FIG. 1, memory device may include a substrate 100. In some embodiments, the substrate 100 may be made of a material including single crystalline silicon, germanium (Ge), silicon-germanium (SiGe), silicon carbide (SiC), silicon-on-insulator (SOI), germanium-on-insulator (GOI), polysilicon, and/or a Group III-V compound such as gallium arsenide (GaAs) or indium phosphide (InP). In some embodiments, the substrate 100 may include an electrically non-conductive material such as glass, a plastic material, or a ceramic material, and may further include a thin layer of polysilicon deposited on the non-conductive material.

In one embodiment, the substrate 100 may be an undoped or lightly doped single crystalline silicon layer. The substrate 100 may be doped differently with p-type or n-type dopants. For example, a doped region 102 may be formed in the substrate 100, e.g., in a top portion of the substrate 100, by doping suitable dopants (e.g., n-type dopants) via ion implantation and/or diffusion. The dopants of the doped region 102 may include, for example, phosphorus (P), arsenic (As), and/or antimony (Sb). The doping of the substrate may be in the thickness direction and/or the width direction. The silicon substrate may be a thinned silicon substrate, e.g., a thinned single crystalline silicon layer. In some embodiments, the single crystalline silicon layer may have a thickness between 200 nm to 50 μm. In some embodiments, the single crystalline silicon layer has a thickness between 300 nm to 5 μm. The single crystalline silicon layer may be partially or fully doped with n-type and/or p-type dopants.

In some embodiments, the memory device may not include any substrate, but rather include a semiconductor layer same or different than the substrate 100. In one embodiment, the semiconductor layer may be a layer containing polysilicon or another different semiconductor material.

A dielectric-pair stack 200 may be formed over the substrate 100. The dielectric-pair stack 200 may include alternating layers of dielectric materials. In one embodiment, the dielectric-pair stack 200 may include dielectric-pairs stacked one over another. A dielectric-pair may include a first dielectric layer 202 (e.g., silicon oxide) and a second dielectric layer 204 (e.g., silicon nitride) that is different from first dielectric layer 202. For example, the first dielectric layers 202 and second dielectric layers 204 may be extended in a lateral direction that is parallel to the surface of the substrate 100. The dielectric-pair stack 200 can be formed by one or more thin film deposition processes including, but not limited to, chemical vapor deposition (CVD), physical vapor deposition (PVD), atomic layer deposition (ALD), or any combination thereof.

In some embodiments, the dielectric-pair stack 200 can include a plurality of silicon oxide/nitride layer pairs. Each dielectric-pair includes a layer of silicon oxide 202 and a layer of silicon nitride 204. The plurality of oxide/nitride layer pairs are also referred to herein as an "alternating oxide/nitride stack." For example, in the dielectric-pair stack 200, multiple oxide layers 202 and multiple nitride layers 204 alternate in a vertical direction. In other words, except a top and a bottom layer of a given alternating oxide/nitride stack, each of the other oxide layers 202 can be sandwiched by two adjacent nitride layers 204, and each of the nitride layers 204 can be sandwiched by two adjacent oxide layers 202.

Oxide layers can each have the same thickness or have different thicknesses. For example, thickness of the oxide layer may be in a range from 10 nm to 100 nm, e.g., about 25 nm. Nitride layers can each have the same thickness or have different thicknesses. For example, thickness of the nitride layer can be in a range from 10 nm to 100 nm, e.g., about 35 nm.

According to various embodiments of the present disclosure, the oxide layers 202 and/or nitride layers 204 may include any suitable oxide materials and/or nitride materials. For example, the oxide materials may include silicides, and the element of nitride materials may include, but is not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The dielectric-pair stack 200 can include any suitable number of layers of the oxide layers 202 and the nitride layers 204. In some embodiments, a total number of layers of the oxide layers 202 and the nitride layers 204 in the dielectric-pair stack 200 is equal to or greater than 64. For example, number of oxide/nitride layer pairs can be equal to or larger than 32. In some embodiments, the alternating oxide/nitride stack 200 includes more oxide layers or more nitride layers with different materials and/or thicknesses than the oxide/nitride layer pair.

In some embodiments, the oxide layer may be used as an isolation layer and the nitride layer may be used as a sacrificial layer. The sacrificial layers may be subsequently removed and replaced by conductor layers, e.g., made of an electrically conductive material.

In some embodiments, a channel structure 400 can be formed extending through the dielectric-pair stack 200 and partially penetrating the doped region 102 in the substrate 100. The channel structure 400 can be formed by forming a channel hole 401 extending through the dielectric-pair stack 200 and into the doped region 102 in the substrate 100, followed by filling desired materials/structures in the channel hole 401.

The channel hole 401 may be formed extending in the Z direction or in a direction approximately perpendicular (e.g., vertically) to a surface of the substrate 100. The channel hole 401 may be formed by, e.g., a dry etch process or a combination of dry and wet etch processes. Other fabrication processes may also be performed, such as a patterning process involving lithography, cleaning, and/or chemical mechanical polishing (CMP). Channel hole 401 may include any desirable shape, e.g., a cylinder shape or pillar shape.

After the channel hole 401 is formed, a functional layer 410 may be formed on the sidewall and bottom of the channel hole 401, and further over top surface of the dielectric-pair stack 200. The functional layer 410 may include a blocking layer 412, a charge trap layer 414, and a tunneling layer 416.

The blocking layer 412 may be formed on the sidewall and bottom of the channel hole 401 and on a top surface of the dielectric-pair stack 200. The blocking layer 412 may be formed to block an outflow of charges. The blocking layer 412 may include one or more layers formed by one or more materials. The material for the blocking layer 412 may include silicon oxide, silicon nitride, silicon oxynitride, a high-k dielectric material (such as aluminum oxide or hafnium oxide), a wide bandgap material, etc. In one example, the blocking layer 412 may be an oxide layer formed by in-situ steam generation (ISSG) oxidation after a silicon nitride deposition process. In some embodiments, a thickness of the blocking layer 412 may be less than 20 nm.

The charge trap layer 414 may be formed over the blocking layer 412 to store electronic charges during an operation of the memory device. The storage and/or removal of charges in the charge trap layer 414 can impact the on/off state and/or a conductance of, e.g., the channel layer. The charge trap layer 414 may include one or more layers made of one or more materials. The materials for the charge trap layer 414 may include polysilicon, silicon nitride, silicon oxynitride, nanocrystalline silicon, a wide bandgap material, etc. In some embodiments, the charge trap layer 414 may include a nitride layer formed by a suitable deposition process.

The tunneling layer 416 may be formed over the charge trap layer 414 for tunneling electronic charges (e.g., electrons or holes). The tunneling layer 416 may include one or more layers made of one or more materials. The material for the tunneling layer 416 may include silicon oxide, silicon nitride, silicon oxynitride, a high-k dielectric material (such as aluminum oxide or hafnium oxide), a wide bandgap material, etc.

In some embodiments, the functional layer 410 may include an oxide-nitride-oxide (ONO) structure. For example, the functional layer 410 may include a silicon oxide layer for the blocking layer 412, a silicon nitride layer for the charge trap layer 414, and another silicon oxide layer for the tunneling layer 416, although any suitable structure different from the ONO configuration can be formed for the functional layer 410 according to various embodiments of the present disclosure.

The channel structure further includes a channel layer 420 formed over the tunneling layer 416 in the channel hole 401. In one embodiment, the channel layer 420 may be referred to as a "semiconductor channel." For example, the channel structure may be, e.g., a polysilicon layer. In another embodiment, the channel layer 420 may include amorphous silicon or single crystalline silicon.

The functional layer 410 may be formed between the dielectric-pair stack 200 and the channel layer 420. The channel layer 420 and each of the blocking layer 412, the charge trap layer 414, and the tunneling layer 416 may be formed by, e.g., CVD, PVD, ALD, or a combination thereof.

The channel structure may further include a dielectric filling material 430 formed over the channel layer 420 to at least partially fill the channel hole 401.

Referring back to FIG. 1, a semiconductor layer 150 may be formed between the substrate 100 and the dielectric-pair stack 200 along a vertical direction with respect to the substrate 100. The channel layer 420 may pass through the semiconductor layer 150, e.g., having a portion of side wall of the channel layer 420 physically connected to the semiconductor layer 150, while a portion of the channel structure, e.g., including a portion of each of the functional layer 410, the channel layer 420, and the dielectric filling material 430, may be formed in the doped region 102 of the substrate 100 and may be separated with their other portions by the semiconductor layer 150.

In one embodiment, the semiconductor layer 150 may be formed by forming a sacrificial layer over the substrate 100, followed by forming the dielectric-pair stack 200. In some embodiments, slits (e.g., gate line slits) may be formed extending through the dielectric-pair stack 200 exposing the sacrificial layer. The sacrificial layer, along with a portion of the functional layer, may then be removed to form a cavity, which may then be filled with a semiconductor material (e.g., polysilicon) to form the semiconductor layer 150. In one embodiment, the semiconductor layer 150 may be doped. The semiconductor layer 150 may be formed over the exposed surface of the doped region 102 and over the portion of side wall of the channel layers 420. The semiconductor layer 150 may be electrically connected to the doped region 102 and the channel layers 420. Slit structures (e.g., slit structure 600 shown in FIG. 8) may be subsequently formed in the slits.

In some embodiments, a selective epitaxial growth may be performed such that a layer of single crystalline silicon is grown on the exposed surface of the doped region 102 and a polysilicon layer is grown on the exposed surface of the channel layer 420. As such, the semiconductor layer 150 may include adjoined layers of single crystalline silicon and polysilicon in according to various embodiments of the present disclosure.

The dielectric filling material 430 may be formed over the channel layer 420 to partially fill the remaining space of the channel hole 401 using one or more thin film deposition processes, such as CVD, PVD, ALD, electroplating, electroless plating, or any combination thereof.

The dielectric filling material 430 may be formed by multiple processes, for example, a deposition process, such as an atomic layer deposition (ALD) process, followed by an etching back process (e.g., wet and/or dry etch), to thus form the opening 432. In one embodiment, the dielectric filling material 430 may include a lower portion, formed by a first ALD process and a first etch back process, and an upper portion formed by a second ALD process and a second etch back process. In some embodiments, one or more airgaps may be formed in the dielectric filling material 430, e.g., to avoid wafer bowing. The dielectric filling material 430 may include any suitable dielectric material, such as silicon oxide. In some embodiments, a diluted hydrofluoric acid (HF) cleaning process can be performed to clean the opening 432.

A portion of each of the functional layer 410, the channel layer 420, and/or the dielectric filling material 430, that is above the dielectric-pair stack 200 may be removed to provide a surface for forming a sacrificial layer 320 thereon, as illustrated in FIG. 1. Any suitable wet/dry etch process and/or a chemical mechanical polishing (CMP) process may be used for the removal to expose the top surface of the dielectric-pair stack 200. The top surfaces of the functional layer 410, the channel layer 420, and/or the dielectric filling material 430 may be coplanar with the top surface of the dielectric-pair stack 200.

Still in FIG. 1, the sacrificial layer 320 may be formed over the top surfaces of the functional layer 410, the channel layer 420, the dielectric filling material 430, and the dielectric-pair stack 200.

The sacrificial layer 320 may include any suitable semiconductor or conductive materials that can be used as a hard mask layer during a subsequent etch process to form recess (e.g., referring to recess 402 in FIG. 4), and that can be removed by any suitable etch process, e.g., an isotropic wet etch.

The sacrificial layer 320 may include any nitride material, e.g., element of the nitride material may include silicon or doped silicon (e.g., SiN), tantalum (e.g., TaN), tungsten (e.g., tungsten nitride (WN)), cobalt (Co), copper (Cu), aluminum (Al), silicide (e.g., tungsten silicide (WSi)), or any combination thereof. Any other suitable materials, such as carbon, $Al_2O_3$, silicon carbide (SiC), nitrogen-doped silicon carbide (NDC), and/or silicon carbonitride (SiCN), may be used for the sacrificial layer 320. The sacrificial layer 320 may formed by any suitable deposition process(es), such as ALD, CVD, PVD, etc.

Referring to FIG. 2, a TSG (top select gate) cut structure 350 may be formed through a portion of the sacrificial layer 320 over the dielectric-pair stack 200. The TSG cut structure 350 may be formed by forming a TSG cut 301 (e.g., a through-hole) passing through an entire thickness of the sacrificial layer 320 and filling the TSG cut 301 with any desired materials/structures.

The TSG cut 301 may have inclined sidewalls as shown in FIG. 2. However, embodiments of the disclosure are not limited thereto. In some other embodiments, the TSG cut 301 may have substantially vertical sidewalls. The TSG cut 301 may have various cross-sections in the x-y plane, and may have a narrower width along the y-direction, compared with the width of the channel hole 401.

In one embodiment, dielectric materials may be used to fill the TSG cut 301 to form the TSG cut structure 350. In another embodiment, the TSG cut structure 350 may include similar structures (e.g., including a functional layer, a channel layer, and a dielectric filling material) as for the channel structure 400 formed in the channel hole 401.

Referring back to FIG. 10, at 1004, a channel plug structure may be formed. The channel plug structure may include a lower plug portion formed in the dielectric-pair stack and an upper plug portion formed through the sacrificial layer. In some embodiments, FIGS. 3-4 and 5A-5C illustrate corresponding structures.

Figure 3:
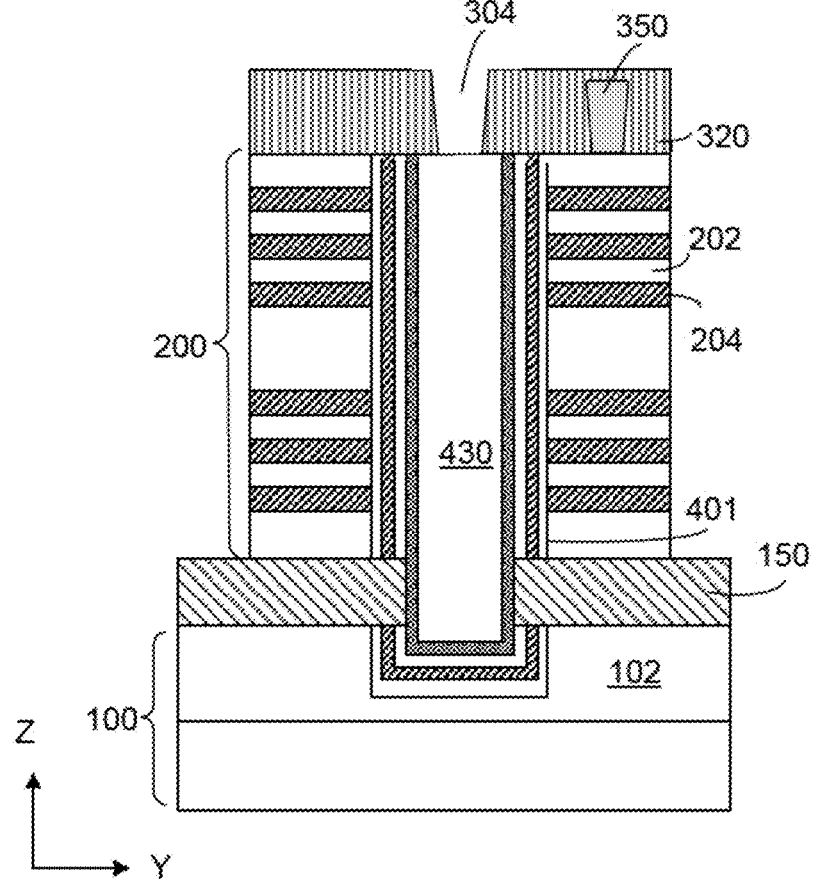

Referring to FIG. 3, a trench 304 may be formed passing through the sacrificial layer 320 to partially expose a surface of the dielectric filling material 430.

The trench 304 may be formed by patterning the sacrificial layer 320 using photolithographic process (e.g., using a patterned photoresist layer), followed by an etch process, including a dry etch process, a wet etch process, or a combination thereof.

In some embodiments, the trench 304 may have inclined sidewalls as shown in FIG. 3. However, embodiments of the disclosure are not limited thereto. In some other embodiments, the trench 304 may have substantially vertical sidewalls.

In an exemplary embodiment, formation of the trench 304 can be controlled without exposing any portion of the channel layer 420. For example, regardless of the shape of the sidewall(s) and/or size changes of the width of the trench 304 along a thickness direction over the substrate 100, the trench 304 may only expose surface of the dielectric filling material 430 without causing damages to the channel layer 420 during formation of the trench 304. The channel layer 420 may be covered by the sacrificial layer 320.

Figure 4:
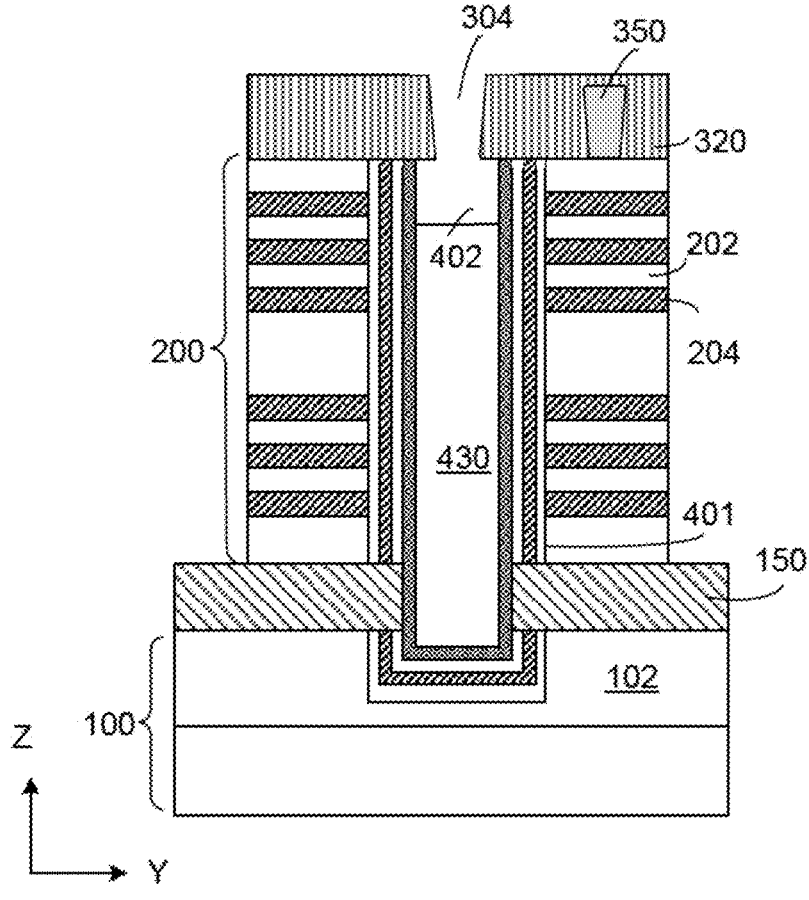

Referring to FIG. 4, a portion of the dielectric filling material 430 may be removed to form a recess 402 in the channel structure 400. The recess 402 may be formed above a surface of a remaining part of the dielectric filling material 430 in the channel hole 401 and under the sacrificial layer 320.

Depending on the material of the dielectric filling material 430 and the sacrificial layer 320, any suitable methods can be used to form the recess 402 under the sacrificial layer 320. For example, the portion of the dielectric filling material 430 may be removed by a wet etch process (e.g., using phosphoric acid as an etchant) and/or a drying etch process (e.g., a plasma etch process) without affecting the sacrificial layer 320.

Figure 5A:
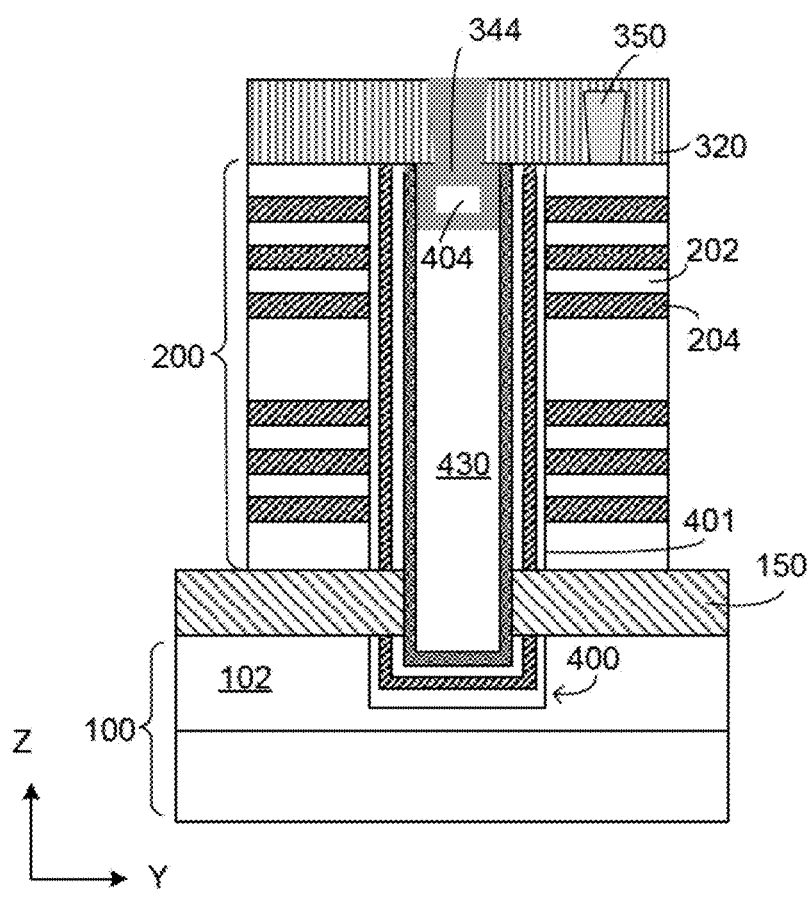

Referring to FIG. 5A, a plug structure 344, also referred to as channel plug structure, may be formed in the recess 402 surrounded by the dielectric filling material 430 and the channel layer 420, and further in the trench 304 in the sacrificial layer 320. For example, the plug structure 344 may be formed over the exposed surface of the dielectric filling material 430, the channel layer 420, to fill the recess 402 in the dielectric-pair stack 200 and to fill the trench 304 in the sacrificial layer 320, e.g., in a single deposition process.

The plug structure 344 may be formed in direct contact with the channel layer 420. The plug structure 344 may include a first portion, e.g., a lower plug portion, formed in the recess 402 in the channel layer 420 under the sacrificial layer 320 and may further include a second portion, e.g., an upper plug portion, extending through the sacrificial layer 320 above the channel layer 420.

As such, by forming the plug structure (or the channel plug structure) in a single step before subsequently forming TSG deck structure, damages to the lower plug portion and/or the channel layer may be reduced or eliminated to prevent any electrical failure or interference of the channel structure. This is in contrast with related processes, in which a channel plug is formed in the stack structure, a deck structure is formed over the stack structure and the channel plug, followed by an etch process (e.g., a plasma etch or other etch process) to form a channel connection through the deck structure to connect to the channel layer. In this case, the etch process often causes damages at interfaces between the channel plug and the channel connection and/or between the stack structure and the deck structure, resulting in a decrease in the channel saturation current, which in turn causes the failure of the page buffer function of the memory device.

The lower plug portion of the plug structure 344 may be in an end portion of the channel structure 400, e.g., of the NAND memory string of the memory device, that is away from the substrate 100 in Z-direction as shown in FIG. 5A. The lower plug portion of the plug structure 344 may be in contact with sidewalls of the channel layer 420, that is away from the substrate 100 in z-direction as shown in FIG. 5A.

The plug structure 344 may include semiconductor materials (e.g., polysilicon or an amorphous silicon layer) or conductive materials (e.g., metals). The plug structure 344 may be formed using one or more deposition processes including, e.g., ALD, CVD, PVD, any other suitable processes.

In one embodiment, the plug structure 344 may be made of polysilicon. In another embodiment, the plug structure 344 may include adjoined layers of single crystalline silicon and polysilicon according to various embodiments of the present disclosure. The plug structure 344 may be formed by selectively growing semiconductor materials to surround the sidewalls of channel layer 420 using sidewall selective epitaxial growth (SEG). The plug structure 344 may be controllably doped, e.g., by controlling an ion implantation process.

In some embodiments, the plug structure 344 may include Ti/TiN or Ta/TaN as an adhesion layer and tungsten as a conductor layer filled in both the recess 402 and the trench 304. In some embodiments, the lower plug portion of the plug structure 344 may function as the drain of corresponding NAND memory string.

The plug structure 344 may include airgap(s) 404 formed in the channel structure 400 when the plug structure 344 is formed to fill the recess 402 and the trench 304. An exemplary method to form the airgaps includes the pinch off deposition. In some embodiments, the plug structure 344 may be formed to completely fill the recess 402 and the trench 304 without forming any airgap(s).

According to various embodiments, the plug structure 344 may include various configurations. For example, FIGS. 5B-5C illustrates other exemplary memory structures 500B-500C.

Figure 5B:
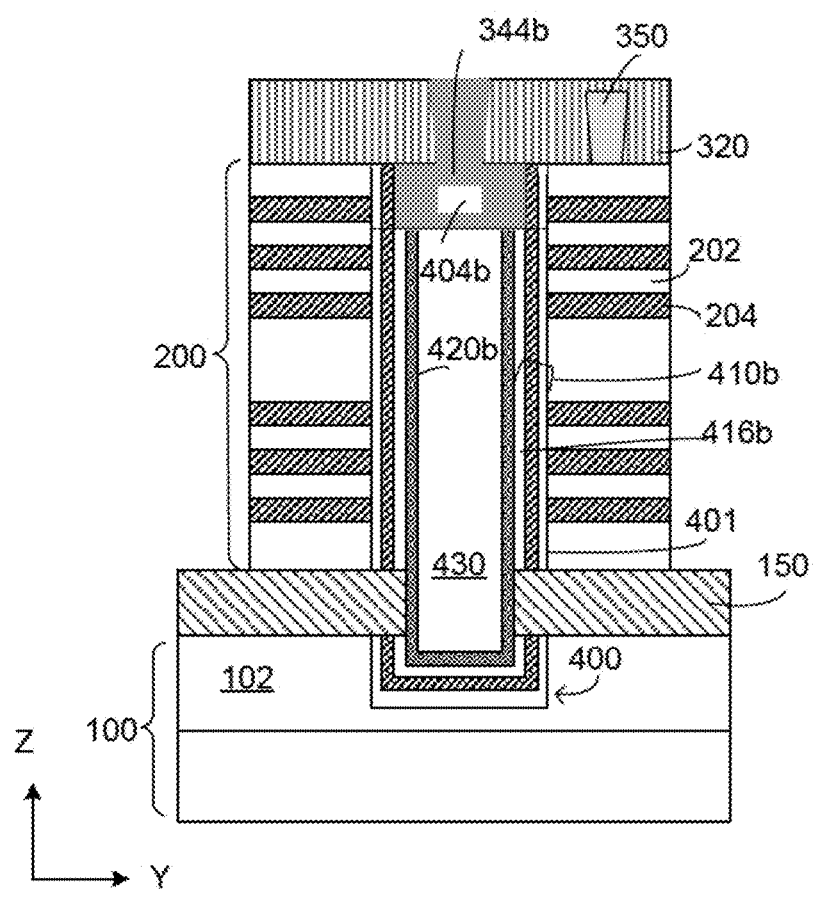
Figure 5C:
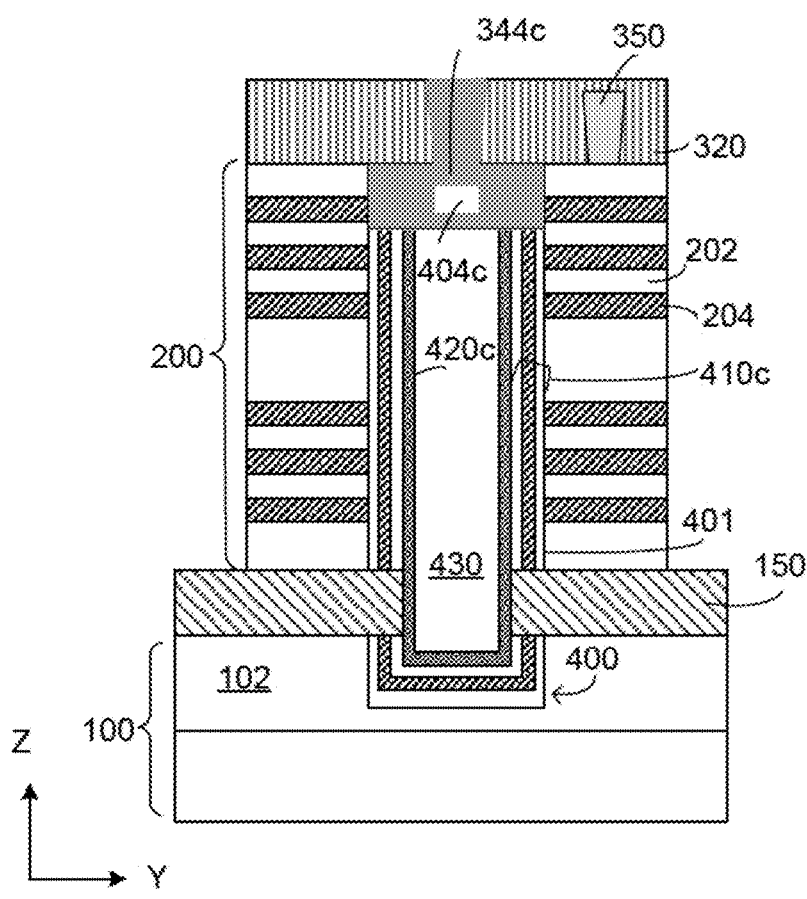

As shown in FIG. 5B, the memory structure 500B may include another exemplary plug structure 344b. Compared with the plug structure 344 in FIG. 5A, the plug structure 344b may include a lower plug portion formed over each of a dielectric filling material 430b, a channel layer 420b, and a tunneling layer 416b of functional layer 410b. The functional layer 410b further includes a charge trap layer 414 and a blocking layer 412. The lower plug portion of the plug structure 344b may thus be surrounded by the charge trap layer of the functional layer 410b.

For forming the plug structure 344b, in one embodiment, a trench (e.g., trench 304) may be formed in the sacrificial layer 320, followed by an etch process through the trench to remove a top portion of the dielectric filling material 430, the channel layer 420, and a tunnelling layer 416 of functional layer 410 using the charge trap layer 414 as an etch stop layer to form a recess. The recess may be surrounded by the charge trap layer 414 of the functional layer 410b. The plug structure 344b may be formed in the recess and the trench, as shown in FIG. 5B.

A bottom surface of the lower plug portion of the plug structure 344b may be in direct contact with a top surface of the channel layer 420b. In various embodiments, the lower plug portion of the plug structure 344*b* in FIG. 5B may or may not include airgaps 404*c*.

In various embodiments, the lower plug portion of the plug structure may be formed further over the charge trap layer and/or tunneling layer 416. For example, as shown in FIG. 5C, the memory structure 500C may include another exemplary plug structure 344*c*. Compared with the plug structure 344 in FIG. 5A, the plug structure 344*c* may include a lower plug portion formed over an entire surface of each of a dielectric filling material 430*c*, a channel layer 420*c* and a functional layer 410*c* (including a portion of each of the blocking layer 412, a charge trap layer 414, and a tunneling layer 416).

A bottom surface of the lower plug portion of the plug structure 344*c* may be in direct contact with a top surface of the channel layer 420*c*. In various embodiments, the lower plug portion of the plug structure 344*c* in FIG. 5C may or may not include airgaps 404*c*. Referring back to FIG. 10, at 1006, a barrier layer may be formed and may at least envelop the upper plug portion of the channel plug structure after a removal of the sacrificial layer. In some embodiments, corresponding structures are illustrated in FIGS. 6-7.

Figure 6:
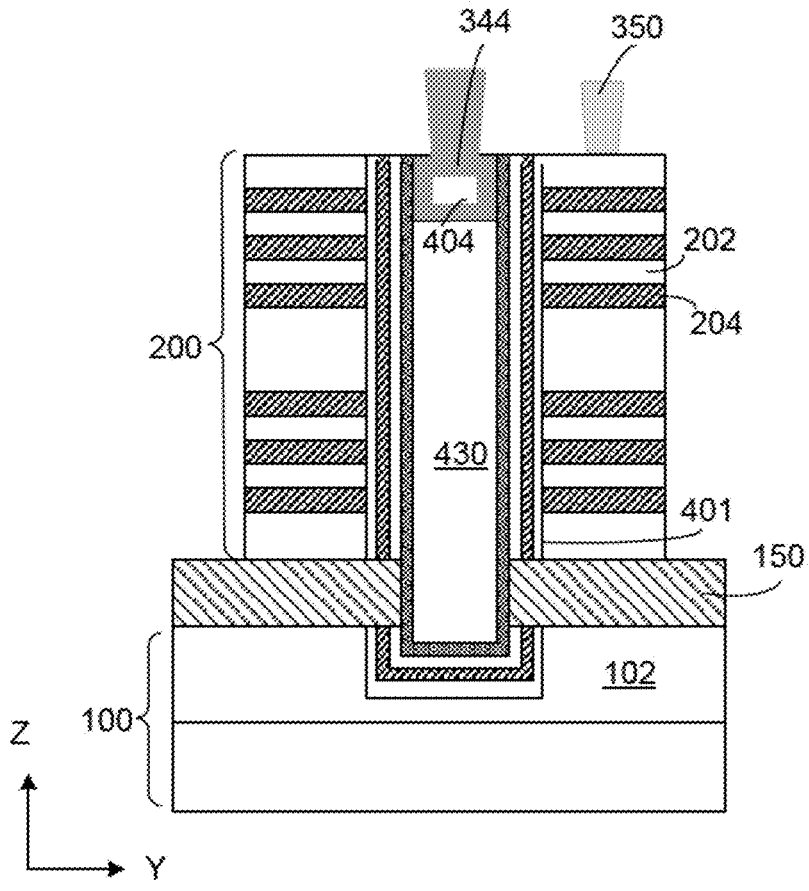
Figure 7:
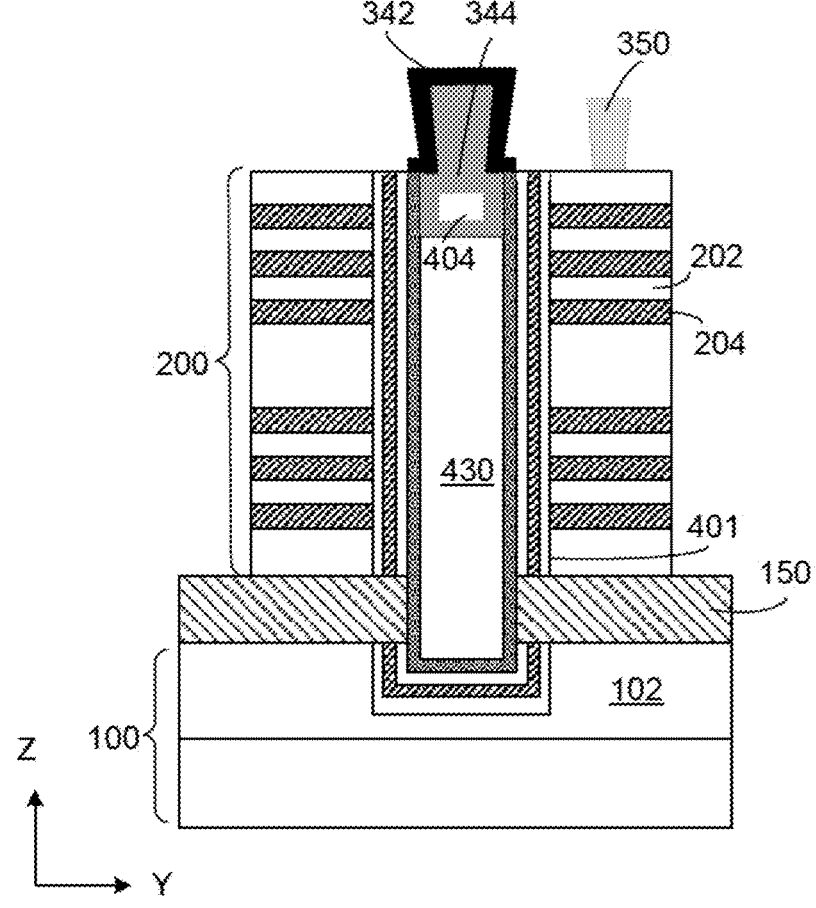

Referring to FIG. 6, the sacrificial layer 320 may be removed. The plug structure 344 and the TSG cut structure 350 remain protruding over the top surface of the dielectric-pair stack 200.

As shown, the orthographic projections of the plug structure 344 and the TSG cut structure 350 on the substrate 100 (or on a plane perpendicular to an extending direction of the channel layer) may be non-overlapped.

The plug structure 344 may have an irregular shape with irregularly changed cross sections. The TSG cut structure 350 may also have varying cross sections. A minimum cross section area of the plug structure 344 may include a maximum cross section area of the TSG cut structure 350.

Referring to FIG. 7, a barrier layer 342 may be formed over/in exposed surface of the plug structure 344 and/or over/in exposed surface of the channel layer 420. For example, barrier layer 342 may be formed enveloping the upper plug portion of the plug structure 344, and may further be formed over the exposed surface of the lower plug portion and/or further over the exposed surface of the channel layer 420.

In one embodiment, the barrier layer 342 may be formed by a dielectric material. Any suitable process(es) may be used to form the barrier layer 342, including but not limited to a deposition process, a selective oxidation process, etc. The deposition process may include, for example, CVD, PVD, and/or ALD, to form the barrier layer 342 over exposed surface of the plug structure 344 and/or over exposed surface of the channel layer 420. The selective oxidation process may include a thermal oxidation, a wet oxidation, etc., to form the barrier layer 342 by converting the exposed surface of the plug structure 344 and/or exposed surface of the channel layer 420 into the barrier layer 342.

For example, the barrier layer 342 may include a silicon oxide layer formed by a selective oxidation process of the material of the plug structure 344 and/or the material of the channel layer 420, e.g., by a wet oxidation process.

The wet oxidation process may include a flash vaporizer oxidation, a pyrogenic oxidation, a DI water bubbler oxidation at any suitable temperature. For example, the material of the plug structure 344 and/or the channel layer 420, such as silicon material, may be treated by low temperature wet oxidation processing (e.g., using deionized water/ozone) such that the material is highly oxidized and contains substantially no voids. Other oxidation methods may be used to form the barrier layer 342, e.g., a dry oxidation (such as a remote plasma oxidation), a thermal oxidation, etc.

The barrier layer 342 may be formed having a thickness of about 50 angstroms to about 300 nm, e.g., a thickness of about 1 nm or 100 nm. In one embodiment, the barrier layer 342 may be formed conformally over the plug structure 344 and/or the channel layer 420, e.g., having a thickness substantially uniform.

Referring back to FIG. 10, at 1008, a semiconductor layer may be formed over the dielectric-pair stack to embed the TSG cut structure, the barrier layer, and the upper portion of the channel plug structure. In some embodiments, corresponding structures are illustrated in FIGS. 8 and 9A-9C.

Figure 8:
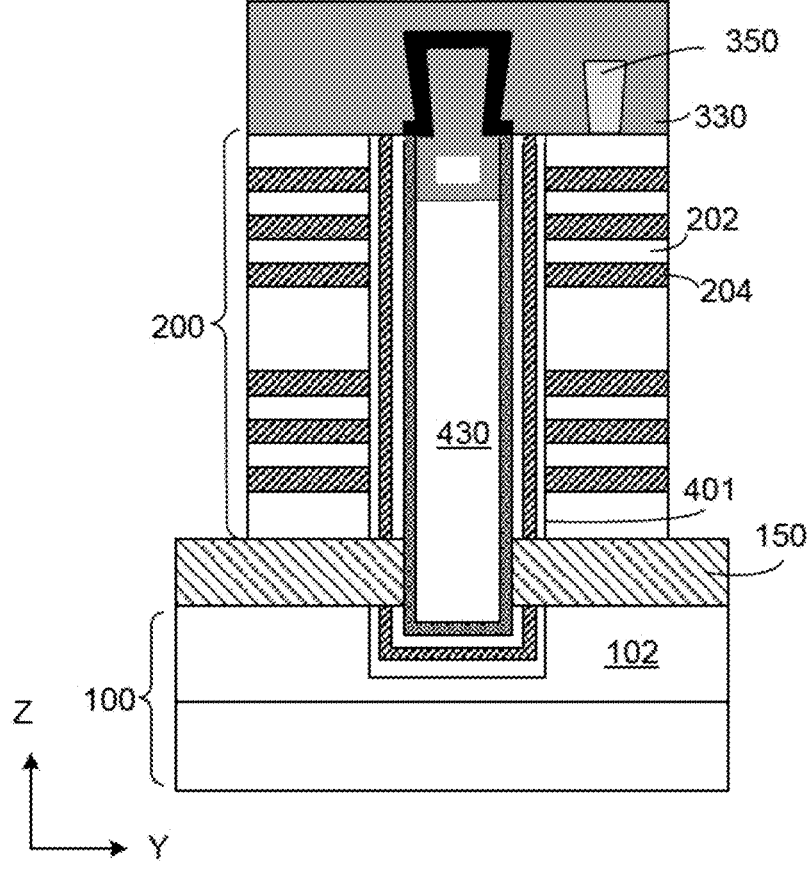

Referring to FIG. 8, a semiconductor layer 330 may be formed over the entire structure shown in FIG. 7 to embed the upper plug portion of the plug structure 344 and the barrier layer 342 and to embed the TSG cut structure 350, over the dielectric-pair stack 200.

Any suitable materials can be used for forming the semiconductor layer 330. The semiconductor layer 330 may include semiconductor materials, e.g., polysilicon or an amorphous silicon layer. The semiconductor layer 330 may be formed using one or more deposition processes including, e.g., ALD, CVD, PVD, any other suitable processes. In one embodiment, the semiconductor layer 330 may be made of polysilicon. The semiconductor layer 330 may be doped, e.g., by an ion implantation process.

Figure 9A:
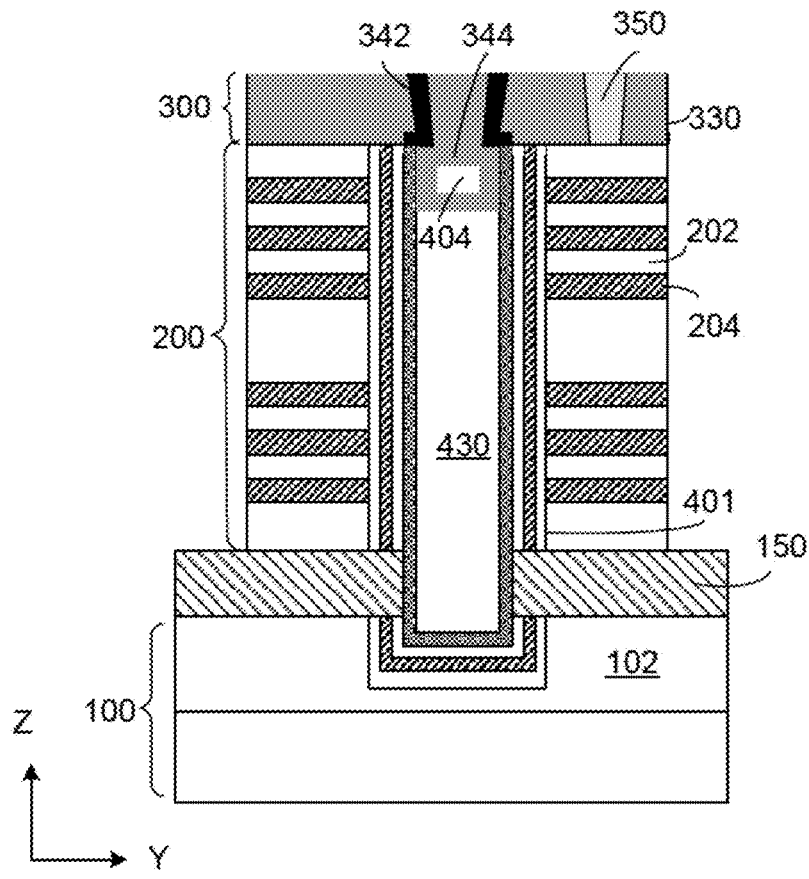

Referring to FIG. 9A, a portion of the semiconductor layer 330 along with a portion of each of the upper plug portion of the plug structure 344, the barrier layer 342, and the TSG cut structure 350 may be removed by a planarizing process including, e.g., any suitable wet/dry etch process and/or a chemical mechanical polishing (CMP) process, to form a TSG deck structure 300 over the dielectric-pair stack 200.

As shown, the TSG deck structure 300 may include the barrier layer 342, the plug structure 344, and the TSG cut structure 350 formed in the semiconductor layer 330, having top surfaces coplanar with each other. In the semiconductor layer 330, the barrier layer 342 may separate the plug structure 344 from the semiconductor layer 330.

Figure 9B:
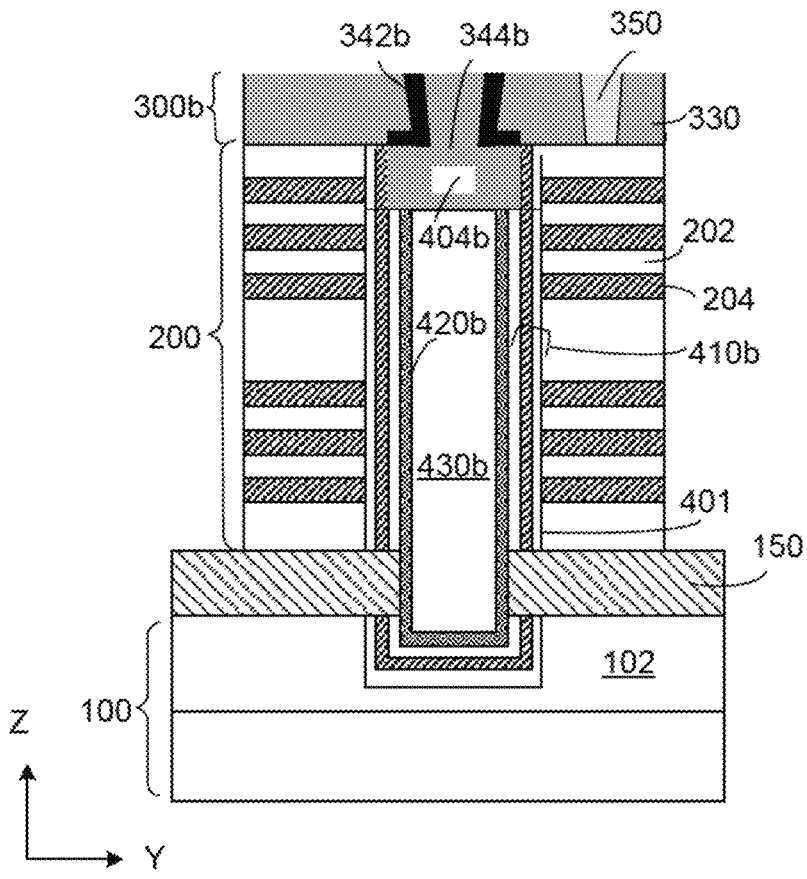

FIG. 9B illustrates another exemplary memory structure 900B corresponding to the memory structure 500B illustrated in FIG. 5B. As shown, the plug structure 344*b* may be formed through the TSG deck structure 300 and into the channel structure 400 in the dielectric-pair stack 200. The lower plug portion of the plug structure 344*b* may be formed under the TSG deck structure 300 and over each of a dielectric filling material 430*c*, a channel layer 420*c* and a tunneling layer 416*b* of a functional layer 410*b*. The lower plug portion of the plug structure 344*b* may be surrounded by a charge trap layer 414 of the functional layer 410*b*. Accordingly, a barrier layer 342*b* may be formed over a surface of the lower plug portion of the plug structure 344*b* between the semiconductor layer and the surface of the lower plug portion, for example, by an oxidation process or a deposition process as described in FIG. 7.

A bottom surface of the lower plug portion of the plug structure 344*b* may be in direct contact with a top surface of the channel layer 420*b*. In various embodiments, the lower plug portion of the plug structure 344*b* in FIG. 9B may or may not include airgaps 404*b*.

Figure 9C:
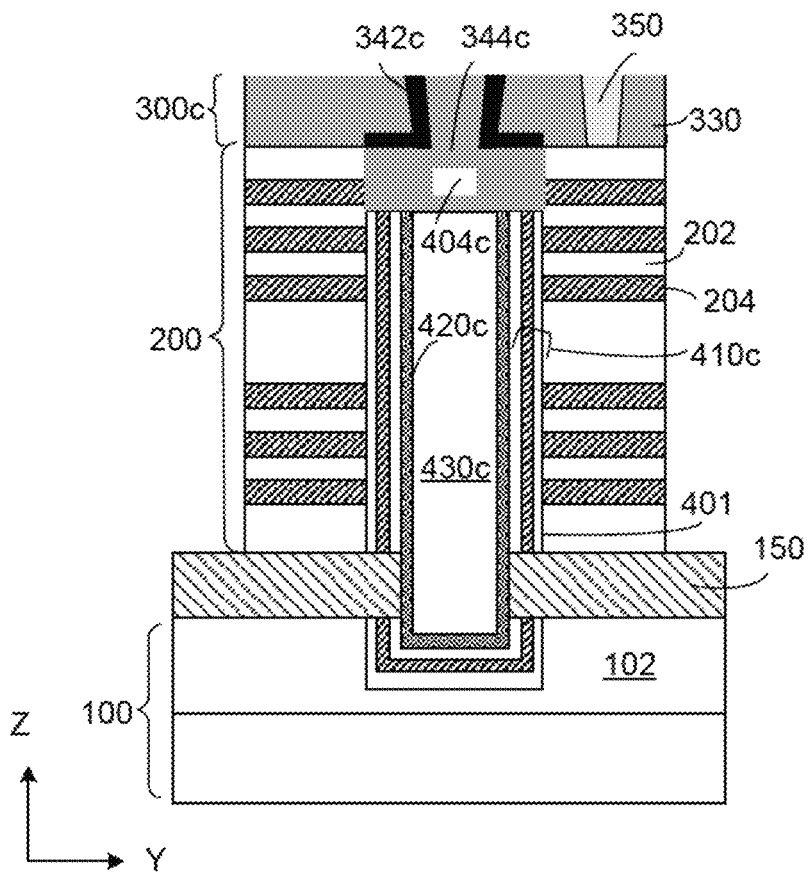

FIG. 9C illustrates another exemplary memory structure 900C corresponding to the memory structure 500C illustrated in FIG. 5C. As shown, the plug structure 344*c* may be formed through the TSG deck structure 300 and into the channel structure 400 in the dielectric-pair stack 200. The lower plug portion of the plug structure 344c may be formed under the TSG deck structure 300 and over an entire surface of each of a dielectric filling material 430c, a channel layer 420c and a functional layer 410c (including a portion of each of the blocking layer 412, a charge trap layer 414, and a tunneling layer 416). Accordingly, a barrier layer 342c may further be formed over an entire surface of the lower plug portion of the plug structure 344c at an interface with the semiconductor layer, for example, by an oxidation process as described in FIG. 7.

A bottom surface of the lower plug portion of the plug structure 344c may be in direct contact with a top surface of the channel layer 420c. In various embodiments, the lower plug portion of the plug structure 344c in FIG. 9C may or may not include airgaps 404c.

In various embodiments, the memory device may include one or more memory structures 900A illustrated in FIG. 9A, one or more memory structures 900B illustrated in FIG. 9B, and/or one or more memory structures 900C illustrated in FIG. 9C.

Figure 11:
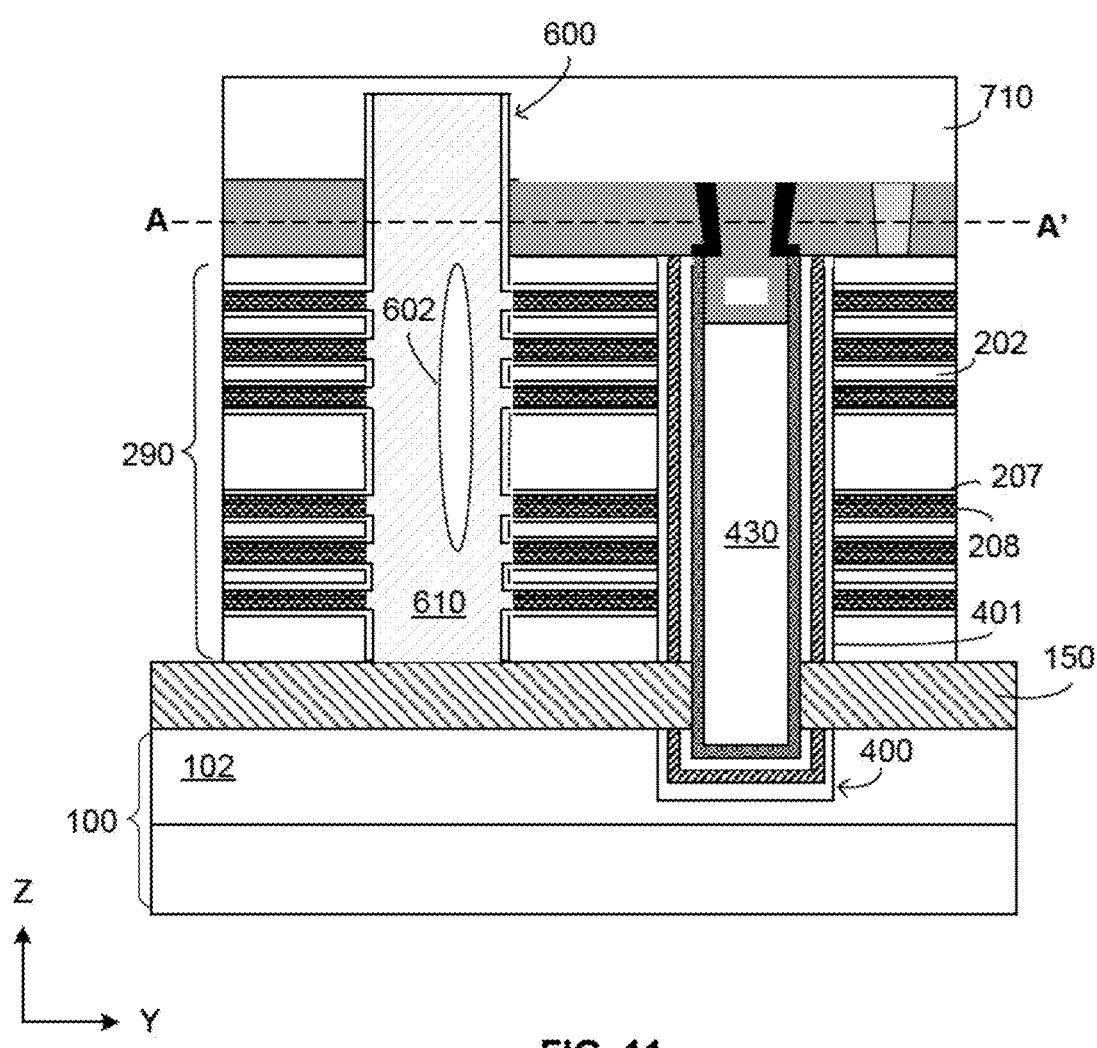
FIG. 11 illustrates another exemplary memory device consistent with various disclosed embodiments of the present disclosure.

FIG. 11 illustrates an exemplary memory structure 1100. Referring to FIG. 11, the second dielectric layers 204 of the dielectric-pair stack 200 may be removed and, each second dielectric layer 204 may be replaced by a high K layer 207 and a conductor layer 208 to form a layer stack 290.

For example, the high K layer 207, such as aluminum oxide, may be deposited on surfaces of the cavities exposed after the removal of the second dielectric layer 204, followed by deposition of a layer of an electrically conductive material such as a metal including, e.g., tungsten (W), to fill the cavities remaining after the high K layer 207 is formed. Other suitable materials, such as cobalt (Co), copper (Cu), aluminum (Al), doped silicon, silicides, and/or titanium nitride, may also be used to form the conductor layers 208. Each conductor layer 208 may be formed between the first dielectric layers 202 to form the layer stack 290. In some embodiments, CVD, PVD, ALD, or a combination of two or more of these processes may be used in the deposition processes for forming the high K layer 207 and the conductor layer 208.

Each conductor layer 208 may be configured to electrically connect one or more rows of NAND memory cells along the Y direction or in the X-Y plane and configured as a word line for the memory device. The channel layer 420 formed in the channel hole 401 may be configured to electrically connect a column or a string of NAND memory cells along the Z direction and configured as a bit line for the memory device. As such, a portion of the functional layer 410 in the channel hole 401 in the X-Y plane, as a part of a NAND memory cell, is arranged between conductor layer 208 and channel layer 420, i.e., between a word line and a bit line. A portion of the conductor layer 208 that is around a portion of the channel hole 401 functions as a control gate or gate electrode for a NAND memory cell.

Still in FIG. 11, a slit structure 600 may be formed extending through the layer stack 290 and the TSG deck structure 300. The slit structure 600 may include, e.g., a dielectric material 610 formed in a slit (such as gate line slit) extending through the layer stack 290 and further through the TSG deck structure 300.

The dielectric material 610 may include, for example silicon oxide, silicon nitride, another dielectric material, or a combination thereof. When forming the dielectric material 610, airgap(s) may be formed in the dielectric material 610. In various embodiments, the airgap may be enclosed by the dielectric material filled within a corresponding gate line slit or enclosed by the dielectric material together with one or more sidewalls of the corresponding gate line slit. In some embodiments, the position, dimension, quantity, and shape of the airgap(s) in the slit structure 600 may be designed as desired.

The dielectric material 610 passing through the TSG deck structure 300 may further formed into a dielectric layer 710. The dielectric layer 710 may be formed over the TSG deck structure 300 and covering the entire structure of the layer stack 290.

Figure 12A:
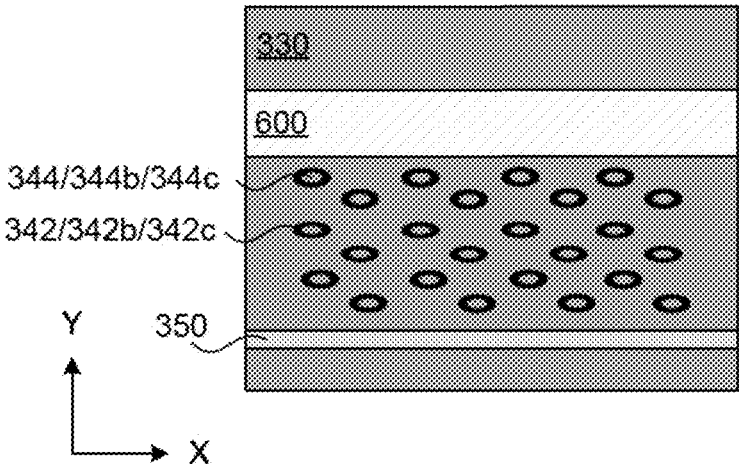
FIGS. 12A-12B illustrate other exemplary memory devices consistent with various disclosed embodiments of the present disclosure.
Figure 12B:
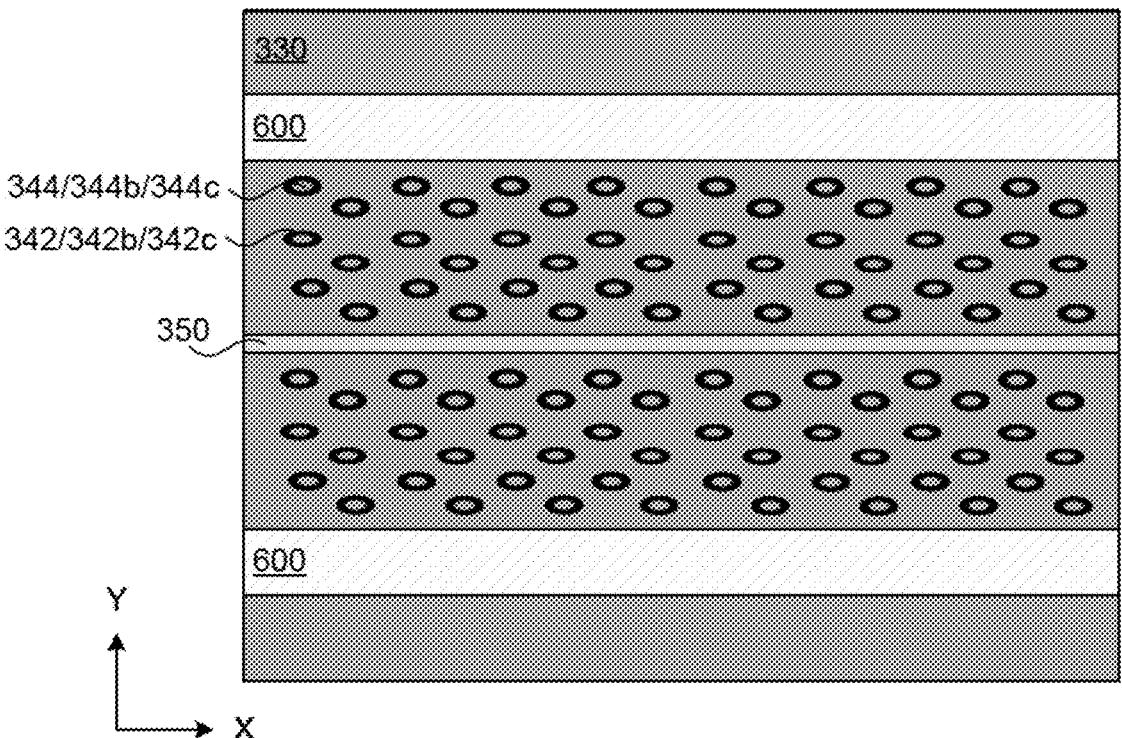

FIGS. 12A-12B illustrate a cross-sectional view of an exemplary memory device consistent with various disclosed embodiments of the present disclosure. FIG. 12A illustrates an A-A' cross-sectional view of the exemplary memory device 1100 in FIG. 11, although only one plug structure 344 (channel structure 400) is shown in FIG. 11 for illustration purposes.

As shown in FIG. 12A, any number of plug structures 344 (corresponding to memory device 900A), any number of plug structures 344b (corresponding to memory device 900B) and/or any number of plug structures 344c (corresponding to memory device 900C) may be included between the slit structure 600 and the TSG cut structure 350 along Y-direction.

FIG. 12B illustrates a cross-sectional view of an extended area of the memory device according to various embodiments of the present disclosure. The memory device may include multiple slit structures 600 (e.g., gate line slit structures) and multiple TSG cut structures 350. One or more TSG cut structures 350 may be included between adjacent slit structures 600. The slit structures 600 and the TSG cut structures 350 may extend laterally in the X-direction.

For example, an even number N (e.g., 8, 12) rows of plug structures 344/344b/344c (corresponding to channel structures 400) may be arranged in a staggered manner between neighboring slit structures 600. The TSG cut structure 350 may be located to separate rows of plug structures/channel structures between neighboring slit structures 600 into two equal groups, for example.

In some embodiments, the TSG cut structure 350 can include a strip shape or a wavy shape. In some embodiments, a width of TSG cut structure 350 along Y-direction may be in a range from about 10 nm to about 110 nm, which is less than a diameter (or an equivalent width along Y-direction) or a minimum diameter of the plug structure 344/344b/344c (corresponding to channel structure 400) in a Y-direction. As such, without occupying the location of a row of channel structures, the TSG cut/TSG cut structure may be arranged between adjacent slit structures. Further, the TSG cut/TSG cut structures are formed in a TSG deck structure formed completely over the dielectric-pair stack/layer stack, rather than being formed within a top layer or a top portion (e.g., the first dielectric layer 202, the second dielectric layer 204, the high K layer 207, and/or the conductor layer 208) of the dielectric-pair stack/layer stack, die size along Y-direction or bit line direction of the 3D memory device may thus be reduced, with improved area utilization of wafers and reduced production cost.

Figure 13:
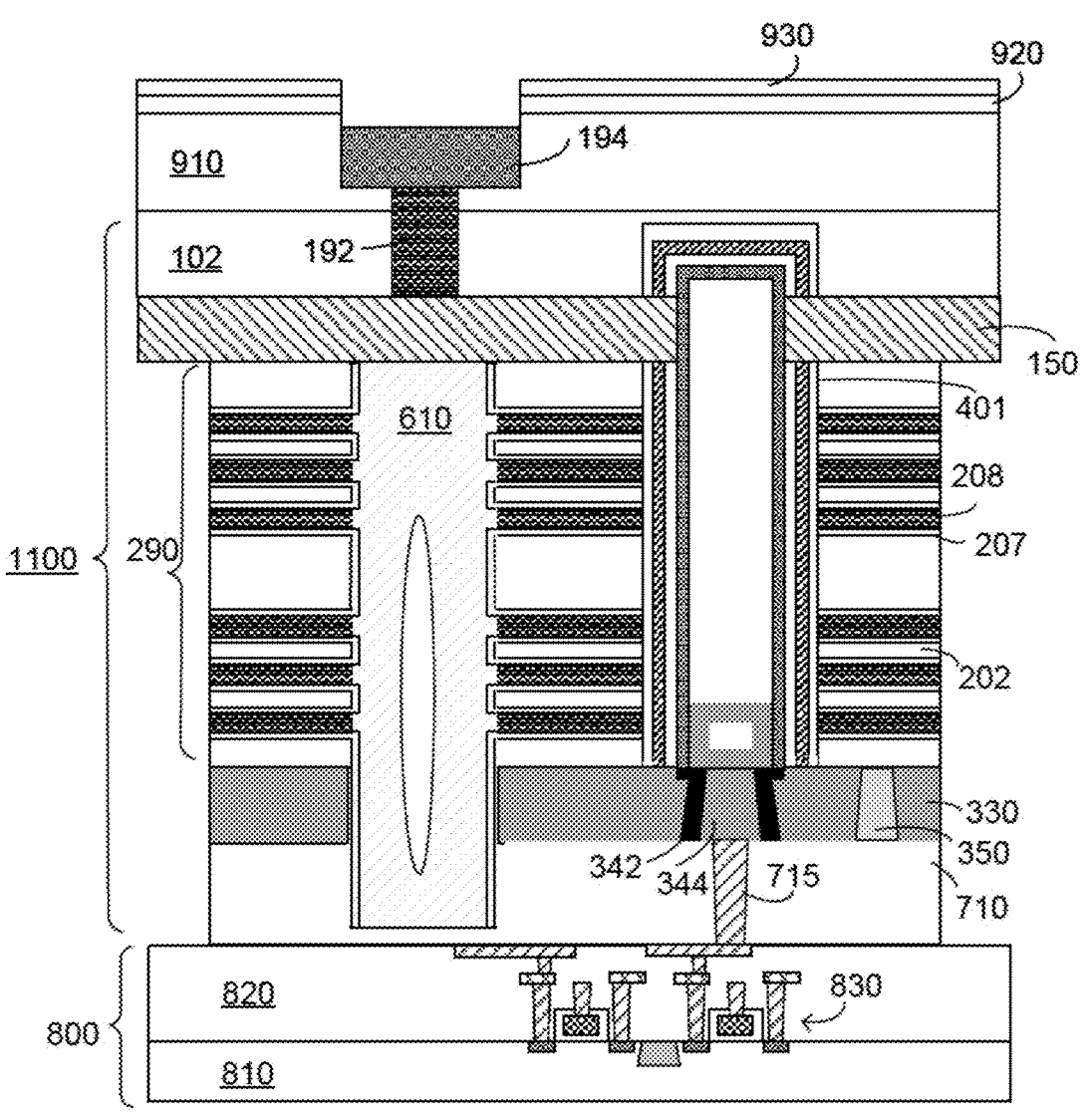
FIG. 13 illustrates a cross-section view of another exemplary memory device consistent with various disclosed embodiments of the present disclosure.

Referring to FIG. 13, the memory device may further include a peripheral device 800 that is configured for controlling signals to and from the array structure, e.g., as shown in FIGS. 12A-12B.

The peripheral device 800 may include a substrate 810 including, e.g., single crystalline silicon, Ge, SiGe, SiC, SOI, GOI, polysilicon, or a Group III-V compound such as GaAs or InP. Peripheral circuits 830 (e.g., control circuits)

may be formed in a dielectric layer 820 over the substrate 810, and used for facilitating the operation of the memory device. For example, the peripheral circuits 830 may include metal-oxide-semiconductor field-effect transistors (MOS-FETs) and provide functional devices such as page buffers, sense amplifiers, column decoders, and row decoders.

The memory structure 1100 (or array structure) and peripheral device 800 may be bonded, e.g., by a flip-chip bonding method. For example, the memory structure 1100 may be flipped in a z-direction to bond and electrically connect with the peripheral circuits 830 via contact 715 formed in the dielectric layer 710.

The substrate 100 of the memory structure 1100 may be thinned by a thinning process, such as wafer grinding, dry etch, wet etch, CMP, or a combination thereof. The doped region 102 of the substrate 100 may then exposed, followed by forming a dielectric layer 910 over the doped region 102. A conductive layer 920 (such as Cu, W, Co, Cu, and/or Al) may be formed over the dielectric layer 910, and a polymeric substrate 930 (such as polyimide) may be formed over the conductive layer 920. A pad opening may be formed, such that a first pad structure 192 (e.g., polysilicon) is formed in the doped region 102 and a second pad structure 194 is formed in the dielectric layer 910 and connecting the first pad structure 192. The second pad structure 194 may include a top surface lower than the conductive layer 920.

As disclosed herein, the upper plug portion of the channel plug structure 344 may be coplanar with the semiconductor layer 330, which is different than a structure including a surface of a channel plug coplanar with a surface of an etch stop layer that is formed over the semiconductor layer. As such, the contact 715 that connects the upper plug portion of the channel plug structure 344 may have a lateral dimension less than a lateral dimension of the upper plug portion of the channel plug structure 344 at the interface there-between.

In some embodiments, the disclosed memory device may include the memory/array structure and multiple peripheral devices. The multiple peripheral devices (or 3D array devices) may be bonded with a corresponding 3D array device (or a corresponding peripheral device) sequentially in separate bonding processes. In some other embodiments, the multiple peripheral devices (or 3D array devices) may be bonded with a corresponding 3D array device (or a corresponding peripheral device) simultaneously in one boding process. In other embodiments, the memory device may include a peripheral device and multiple 3D array devices that are the same as or similar.

As disclosed, air gaps may be designed and configured in the slit structures, the plug structures, and/or dielectric filling materials of the channel structure of the disclosed memory device with desired positions, dimensions, quantities, and shapes, e.g., to reduce wafer bow to improve quality of the formed memory devices.

Figure 14:
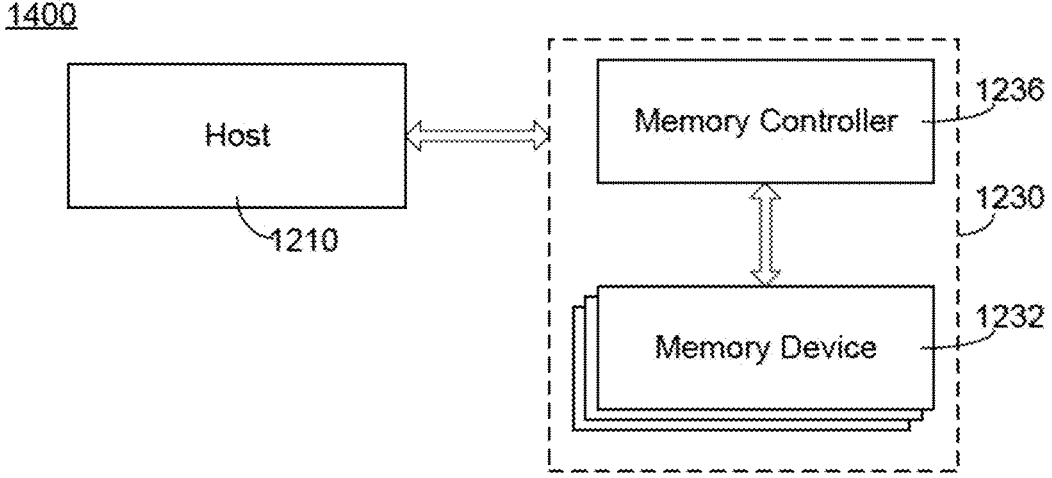
FIG. 14 illustrates an exemplary memory system consistent with various disclosed embodiments of the present disclosure.

FIG. 14 illustrates an exemplary memory system 1400 according to various embodiments of the present disclosure. In various embodiments, the memory system 1400 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein.

As shown in FIG. 14, the memory system 1400 may include a host 1210 and a memory system 1230 including one or more memory devices 1232 and a memory controller 1236. The host 1210 may be a processor of an electronic device, such as a central processing unit (CPU), or a system-on-chip (SoC), such as an application processor (AP). The host 1210 may be configured to send or receive data to or from the memory devices 1232.

The memory controller 1236 is coupled to the memory devices 1232 and host 1210 and is configured to control the memory devices 1232, according to some embodiments of the present disclosure. The memory controller 1236 may manage the data stored in the memory devices 1232 and communicate with the host 1210. In some embodiments, the memory controller 1236 is designed for operating in a low duty-cycle environment, including, for example, secure digital (SD) cards, compact Flash (CF) cards, universal serial bus (USB) Flash drives, or other media for use in electronic devices, such as personal computers, digital cameras, mobile phones, etc. In some other embodiments, the memory controller 1236 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 1236 may be configured to control operations of the memory device 1232, such as read, erase, and program operations.

The memory controller 1236 may also be configured to manage various functions with respect to the data stored or to be stored in the memory device 1232 including, but not limited to bad-block management, garbage collection, logical-to-physical address conversion, wear leveling, etc. In some embodiments, the memory controller 1236 is further configured to process error correction codes (ECCs) with respect to the data read from or written to the memory device 1232. Any other suitable functions may be performed by the memory controller 1236 as well, for example, formatting the memory device 1232. The memory controller 1236 may communicate with an external device (e.g., the host 1210) according to a particular communication protocol. For example, the memory controller 1236 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory device 1232 may be any memory device disclosed in the present disclosure The memory controller 1236 and one or more memory devices 1232 may be integrated into various types of storage devices, for example, in a same package, such as a universal Flash storage (UFS) package or an eMMC package. The memory system 1200 may be implemented and packaged into different types of end electronic products.

Figure 15:
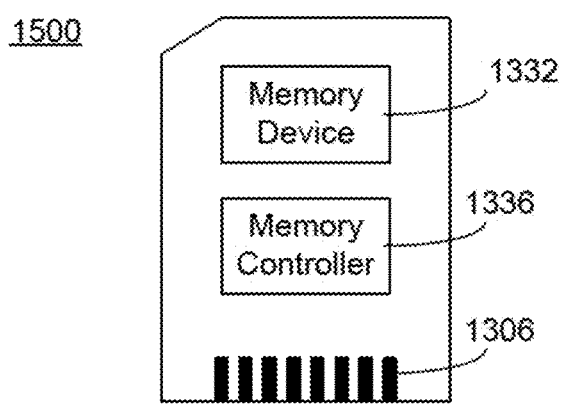
FIG. 15 illustrates an exemplary memory card including a memory device consistent with various disclosed embodiments of the present disclosure.
Figure 16:
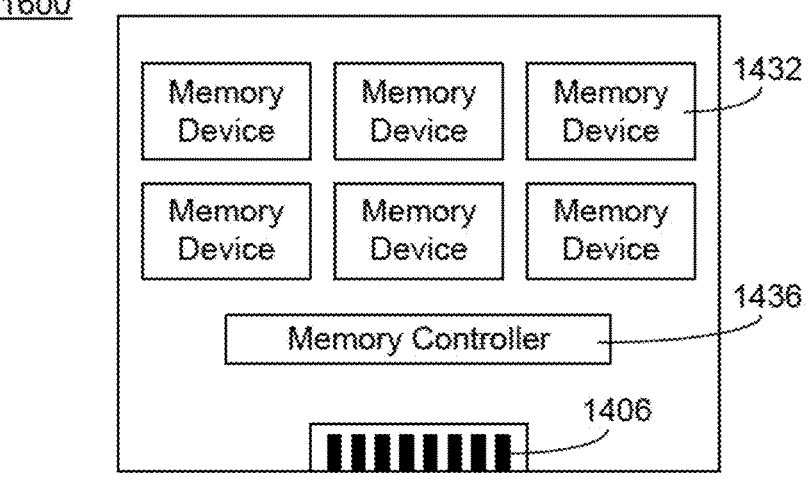
FIG. 16 illustrates an exemplary solid-state drive (SSD) including memory device consistent with various disclosed embodiments of the present disclosure.

FIGS. 15 and 16 illustrate an exemplary memory card 1500 and SSD 1600, respectively, according to various embodiments of the present disclosure.

As shown in FIG. 15, a memory controller 1336 and a single memory device 1332 may be integrated into the memory card 1500. The memory device 1332 may be any memory device disclosed herein. The memory card 1500 may include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc.

The memory card 1500 may further include a memory card connector 1306 configured to couple the memory card 1500 to a host (e.g., the host 1210 shown in FIG. 14).

As shown in FIG. 16, a memory controller 1436 and multiple memory devices 1432 may be integrated into the SSD 1600. The memory devices 1432 may be any memory device disclosed herein. The SSD 1600 may further include an SSD connector 1406 configured to couple the SSD 1600 to a host (e.g., the host 1210 shown in FIG. 14). In some embodiments, the storage capacity and/or the operation speed of the SSD 1600 is greater than those of the memory card 1500.

The above detailed descriptions only illustrate certain exemplary embodiments of the present disclosure, and are not intended to limit the scope of the present disclosure. Those skilled in the art may understand the specification as a whole, and technical features in the various embodiments may be combined into other embodiments understandable to those persons of ordinary skill in the art. Any equivalent or modification thereof, without departing from the spirit and principle of the present disclosure, falls within the true scope of the present disclosure.

What is claimed is:

1. A memory device comprising:
a stack structure;
a semiconductor layer over the stack structure and containing a top selective gate (TSG) cut structure;
a channel plug structure passing through the semiconductor layer, and penetrating into the stack structure under the semiconductor layer and in contact with a channel layer extending through the stack structure; and
a barrier layer including at least a portion formed at a bottom surface of the semiconductor layer above the channel layer.

2. The memory device according to claim 1, wherein
the channel plug structure further includes an upper plug portion in the semiconductor layer and a lower plug portion in the stack structure, and
at an interface between the upper and lower plug portions of the channel plug structure, the upper plug portion includes a width less than the lower plug portion.

3. The memory device according to claim 2, wherein
the barrier layer is further formed between the lower plug portion and the semiconductor layer.

4. The memory device according to claim 1, wherein
a top surface of the channel plug structure and a top surface of the semiconductor layer are coplanar with each other.

5. The memory device according to claim 1, wherein
the barrier layer further comprises a portion through the semiconductor layer, and between the semiconductor layer and an upper plug portion of the channel plug structure along a lateral direction of the semiconductor layer.

6. The memory device according to claim 1, wherein
the channel plug structure includes a lower plug portion, the lower plug portion including a sidewall surrounded by the channel layer; and
the barrier layer is further formed on a top surface of the channel layer.

7. The memory device according to claim 1, further comprising:
a channel structure extending through the stack structure and comprising a functional layer between the channel layer and the stack structure, the functional layer comprising:
a tunneling layer adjacent to the channel layer, a blocking layer adjacent to the stack structure, and a charge trap layer between the blocking layer and the tunneling layer, wherein
a lower plug portion of the channel plug structure is formed above the channel layer and the tunneling layer, and further surrounded by the charge trap layer.

8. The memory device according to claim 1, wherein
the stack structure comprises a dielectric-pair stack or a layer stack comprising alternating layers of a conductor layer and a dielectric layer.

9. A memory system comprising:
a controller, and
a memory device comprising:
a stack structure;
a semiconductor layer over the stack structure and containing a top selective gate (TSG) cut structure;
a channel plug structure passing through the semiconductor layer, and penetrating into the stack structure under the semiconductor layer and in contact with a channel layer extending through the stack structure; and
a barrier layer including at least a portion formed at a bottom surface of the semiconductor layer above the channel layer.

* * * * *